United States Patent
Fujii et al.

(10) Patent No.: US 9,526,160 B2
(45) Date of Patent: Dec. 20, 2016

(54) CAVITY RESONATOR OF MICROWAVE PLASMA GENERATING APPARATUS

(71) Applicant: Adtec Plasma Technology Co., Ltd., Hiroshima (JP)

(72) Inventors: Shuitsu Fujii, Hiroshima (JP); Katsumi Oi, Hiroshima (JP)

(73) Assignee: Adtec Plasma Technology Co., LTD., Hiroshima (JP)

( * ) Notice: Subject to any disclaimer, the term of this patent is extended or adjusted under 35 U.S.C. 154(b) by 0 days.

(21) Appl. No.: 14/397,516

(22) PCT Filed: May 27, 2013

(86) PCT No.: PCT/JP2013/064641
§ 371 (c)(1),
(2) Date: Oct. 28, 2014

(87) PCT Pub. No.: WO2014/192062
PCT Pub. Date: Dec. 4, 2014

(65) Prior Publication Data
US 2016/0157330 A1 Jun. 2, 2016

(51) Int. Cl.
*H05H 1/46* (2006.01)
*H01J 37/32* (2006.01)
*H01P 7/06* (2006.01)

(52) U.S. Cl.
CPC ........... *H05H 1/46* (2013.01); *H01J 37/32192* (2013.01); *H01J 37/32229* (2013.01); *H01J 37/32238* (2013.01); *H01P 7/06* (2013.01); *H05H 2001/4622* (2013.01)

(58) Field of Classification Search
None
See application file for complete search history.

(56) References Cited

U.S. PATENT DOCUMENTS 4,970,435 A * 11/1990 Tanaka ............. H01J 37/32357
118/50.1
5,296,036 A * 3/1994 Matsuyama .......... C23C 16/511
118/718

(Continued)

FOREIGN PATENT DOCUMENTS

JP H01-309972 12/1989
JP H02-062650 5/1990

(Continued)

*Primary Examiner* — Douglas W Owens
*Assistant Examiner* — Srinivas Sathiraju
(74) *Attorney, Agent, or Firm* — Kirschstein, Israel, Schiffmiller & Pieroni, P.C.

(57) ABSTRACT

A resonator body 1 comprises a square-tube-shaped side wall 2 with upper and lower walls. A cavity 5 is formed in the resonator body. The side wall has a microwave supply opening 6. A wave guide 7 is connected to the microwave supply opening through an inductive window 13. The upper and lower walls have reaction tube attachment openings 3a, 4a. A reaction tube 8 is attached to the reaction tube attachment openings and extends vertically through the cavity and cross an axis of the wave guide. Square tubes 10a-10b made of non-magnetic metal meshes are arranged concentrically to the resonator body and in nested manner in the cavity at a distance from both the interior surface of the side wall and the reaction tube.

18 Claims, 7 Drawing Sheets

(56) References Cited

U.S. PATENT DOCUMENTS

| | | | | |
|---|---|---|---|---|
| 5,629,054 A | * | 5/1997 | Kanai | C23C 16/511 118/723 MW |
| 6,096,389 A | * | 8/2000 | Kanai | C23C 16/511 118/723 MR |
| 7,514,377 B2 | * | 4/2009 | Sato | C01B 13/11 118/723 E |
| 7,683,342 B2 | * | 3/2010 | Morfill | H05H 1/30 219/121.48 |
| 7,858,899 B2 | * | 12/2010 | Fujii | H05H 1/30 219/121.48 |
| 8,136,479 B2 | * | 3/2012 | Sugai | H01J 37/32192 118/723 MW |
| 2005/0205016 A1 | * | 9/2005 | Sugai | H01J 37/32192 118/723 MA |
| 2006/0189168 A1 | * | 8/2006 | Sato | C01B 13/11 438/795 |
| 2007/0210038 A1 | * | 9/2007 | Fujii | H05H 1/30 219/121.48 |
| 2008/0237484 A1 | * | 10/2008 | Morfill | H05H 1/30 250/427 |

FOREIGN PATENT DOCUMENTS

| | | |
|---|---|---|
| JP | 2007-016315 | 1/2007 |
| WO | 0061384 | 4/2000 |

* cited by examiner

CAVITY RESONATOR OF MICROWAVE PLASMA GENERATING APPARATUS

TECHNICAL FIELD

The present invention relates to a cavity resonator incorporated in a microwave plasma generating apparatus which generates plasma by means of a microwave.

BACKGROUND ART

A production process of semiconductor integrated circuits includes a film formation processing of forming insulation film such as silicon dioxide film and silicon nitrided film on semiconductor wafers. In the film formation processing, a plasma CVD technique (PECVD) is widely used. In the film formation processing, sediments, which are primarily composed of film forming constituents, are accumulated in a treatment container of a semiconductor production equipment, and if the accumulation of the sediments is not removed, the accumulated sediments fall off the surface of the treatment container and accumulate on the semiconductor wafers, which may lead to incomplete film formation and defect of a device. Therefore, the treatment container needs to be cleaned according to the frequency of the film formation processing.

As one of methods of cleaning the treatment container, a dry-cleaning method is widely used in the prior art. In the dry-cleaning method, the sediments are changed into a silicon tetrafluoride ($SiF_4$) gas by radical fluorine atoms and discharged from the treatment container. In order to produce the radical fluorine atoms, plasma generating methods are conventionally used. In the plasma generating methods, gases containing fluoride atoms are used, and typically hexafluoroethane ($C_2F_6$) or nitrogen trifluoride ($NF_3$) is ionized.

As such ionization methods, an in-situ plasma method and a remote plasma method are known in the prior art. In the in-situ plasma method, the treatment container of the semiconductor production equipment doubles as a plasma generating chamber. In the remote plasma method, the plasma generating chamber is arranged outside of the treatment container of the semiconductor production equipment. As compared to the in-situ plasma method, the remote plasma method has the advantages that the treatment container of the semiconductor production equipment is insulated from damages, and the degradation efficiency by supply gas is high, and cleaning time is cut down and so on. Therefore, the remote plasma method is, especially suitable for a semiconductor production equipment designed for film formation in low temperature (See also, for example Patent Document 1).

As one of plasma generating apparatuses employed for the remote plasma method, there is a microwave plasma generating apparatus which generates plasma utilizing microwave discharge. The microwave plasma generating apparatus comprises, for example, a wave guide extending into a microwave cavity and a gas transport tube extending through the microwave cavity and across an axis of the wave guide, in which a microwave generated by a high-frequency power source is supplied to the wave guide and a gas is supplied to the gas transport tube so that the gas is ionized by electric discharge generated within the gas transport tube (See also, for example, Patent Document 2).

In this microwave plasma generating apparatus, the initial setting of the apparatus is carried out in such a way that the impedance matching is caused to maximize power of the microwave at a position of the inside of the gas transport tube within the microwave cavity, and thereby a standing wave (resonant state) is maintained within the wave guide. The initial setting is also carried out in such a manner that a resonant frequency corresponds to a frequency of the microwave supplied from the high-frequent power source to the wave guide (usually, the frequency is 2.45 GHz, one of bands defined as ISM bands).

However, the resonant frequency fluctuates in the range of hundreds of megahertz under the influence of physical characteristics of the gas transport tube (relative permittivity, diameter and thickness etc.) and change of relative permittivity of the plasma associated with change of density of the plasma generated within the gas transport tube. In addition, when, for example, a silica tube is used as the gas transport tube, the resonant frequency fluctuates in the range of tens of megahertz under influence of change of relative permittivity of the gas transport tube associated with erosion of the interior surface of the gas transport tube by ions and radicals.

Thus in order to maintain effective generation of plasma, the fluctuation of the resonant frequency needs to be corrected. As a method of correction of the fluctuation of the resonant frequency, for example, it may be proposed to make the frequency of the microwave supplied from the high frequency power source variable. However, according to this method, in order to achieve high output power of the microwave, a large-scale and complex power source is required, which leads to increase of manufacturing cost. Furthermore, it is undesirable to fluctuate the frequency of 2.45 GHz in the range of few hundreds megahertz because of deviance from the statutory ISM bands.

As another method of correction of the fluctuation of the resonant frequency, for example, it may be proposed to make the volume of the microwave cavity variable. However, according to this method, it is necessary to make the side walls of the microwave cavity movable and so on, and thereby the structure of the microwave cavity becomes complex and large-scale, which leads to increase of manufacturing cost. In addition, a means for feedback control of the volume of the microwave cavity is required, which leads to further structural complication and cost up of the microwave plasma generating apparatus. Thus the correction of a resonant frequency in a microwave plasma generating apparatus provided with a conventional cavity resonator was accompanied with problems of complicating the microwave plasma generating apparatus and increasing the manufacturing cost.

PRIOR ART DOCUMENTS

Patent Documents

Patent Document 1: JP 2007-16315 A
Patent Document 2: JP 2002-541672 A

SUMMARY OF THE INVENTION

Problems to be Solved by the Invention

It is, therefore, an object of the present invention to provide a cavity resonator which requires no correction of fluctuation of a resonant frequency during operation of a microwave plasma generating apparatus and enables low-cost manufacturing of the apparatus.

Means for Solving the Problems

In order to achieve the object, a first invention provides a cavity resonator incorporated in a microwave plasma generating apparatus by means of a microwave, comprising: a resonator body made of conductor and composed of a square-tube-shaped or cylindrical side wall, an upper wall closing the upper end opening of the side wall, and a lower wall closing the lower end opening of the side wall, a cavity being formed within the resonator body, the square-tube-shaped side wall having an axisymmetric convex polygon cross-section, the side wall of the resonator body being provided with a microwave supply opening, the upper and lower walls of the resonator body being provided with a pair of reaction tube attachment openings, a normal line at the center of the microwave supply opening extending along an axis of symmetry of a cross-section of the side wall; a wave guide connected to the microwave supply opening of the resonator body through an inductive window; a reaction tube made of dielectric and attached to the reaction tube attachment openings in such a way that the reaction tube extends vertically through the cavity and cross an axis of the wave guide; and one or more square tubes or cylinders arranged in nested manner in the cavity at a distance from both the interior surface of the side wall and the reaction tube and extending between the upper and lower walls, the area wherein the square tube or cylinder has a cross-section similar to a cross-section of the cavity and is arranged concentrically to the resonator body, and a grid pattern made of non-magnetic metal is provided on the whole of a side surface of the square tube or cylinder, and the side surface of the square tube or cylinder is provided with an opening at an area thereof which is arranged between the reaction tube and the microwave supply opening and opposed to the microwave supply opening, the opening of the square tube or cylinder corresponding to the microwave supply opening, and the square tube or cylinder is electrically connected to the upper and lower walls of the resonator body at upper and lower ends thereof, wherein plasma is generated by exciting a gas flowing through the reaction tube by a microwave supplied from the microwave supply opening.

According to a preferred embodiment of the first invention, the square tube or cylinder is made of a non-magnetic metal grid or a non-magnetic metal mesh. According to another preferred embodiment of the first invention, dielectric bodies are arranged in gaps between the outermost square tube or cylinder and the interior surface of the side wall of the resonator body and between the adjacent square tubes or cylinders, the dielectric bodies having shapes corresponding to the shapes of the associated gaps. According to further preferred embodiment of the first invention, the square tube or the cylinder is a square-tube-shaped or cylindrical dielectric covered with a non-magnetic metal layer in a grid pattern at a surface thereof.

In order to achieve the object, a second invention provides a cavity resonator incorporated in a microwave plasma generating apparatus by means of a microwave, comprising: a resonator body made of conductor and composed of a square-tube-shaped side wall, an upper wall closing the upper end opening of the side wall, and a lower wall closing the lower end opening of the side wall, a cavity being formed within the resonator body, the side wall having an axisymmetric convex polygon cross-section, the side wall of the resonator body being provided with a microwave supply opening, the upper and lower walls of the resonator body being provided with a pair of reaction tube attachment openings, a normal line at the center of the microwave supply opening extending along an axis of symmetry of the cross-section of the side wall; a wave guide connected to the microwave supply opening of the resonator body through an inductive window; a reaction tube made of dielectric and attached to the reaction tube attachment openings in such a way that the reaction tube extends vertically through the cavity and cross an axis of the wave guide; and a plurality of partition plates arranged in the cavity and extending between the upper and lower walls so as to partition a space between the reaction tube and the interior surface of the side wall, wherein the partition plates are spaced from each other in a direction perpendicular to the axis of symmetry, extend parallel to the axis of symmetry at intervals and are arranged symmetrically about the axis of symmetry, and a grid pattern made of non-magnetic metal is provided on the whole of a side surface of each of the partition plates, and the partition plates are electrically connected to the upper and lower walls of the resonator body at upper and lower ends thereof, wherein plasma is generated by exciting a gas flowing through the reaction tube by a microwave supplied from the microwave supply opening.

In order to achieve the object, a third invention provides a cavity resonator incorporated in a microwave plasma generating apparatus by means of a microwave, comprising: a resonator body made of conductor and composed of a square-tube-shaped side wall, an upper wall closing the upper end opening of the side wall, and a lower wall closing the lower end opening of the side wall, a cavity being formed within the resonator body, the side wall having an axisymmetric convex polygon cross-section, the side wall of the resonator body being provided with a microwave supply opening, the upper and lower walls of the resonator body being provided with a pair of reaction tube attachment openings, a normal line at the center of the microwave supply opening extending along an axis of symmetry of the cross-section of the side wall; a wave guide connected to the microwave supply opening of the resonator body through an inductive window; a reaction tube made of dielectric and attached to the reaction tube attachment openings in such a way that the reaction tube extends vertically through the cavity and cross an axis of the wave guide; and one or more partition plates arranged in the cavity and extending between the upper and lower walls so as to partition a space between the reaction tube and the interior surface of the side wall, wherein the partition plates are spaced from each other in a direction parallel to the axis of symmetry and extend perpendicularly to the axis of symmetry, and a grid pattern made of non-magnetic metal is provided on the whole of a side surface of each of the partition plates, and the one or more partition plates are electrically connected to the upper and lower walls of the resonator body at upper and lower ends thereof, wherein plasma is generated by exciting a gas flowing through the reaction tube by a microwave supplied from the microwave supply opening.

According to a preferred embodiment of each of the second and third inventions, the partition plate is made of a non-magnetic metal grid or a non-magnetic metal mesh. According to another preferred embodiment of each of the second and third inventions, dielectric bodies are arranged in gaps between the outermost partition plate and the interior surface of the side wall of the resonator body and between the adjacent partition plates, the dielectric body having a shape corresponding to the shape of the associated gap. According to further preferred embodiment of each of the second and third inventions, the partition plate is a dielectric plate covered with a non-magnetic metal layer in a grid pattern at a surface thereof.

Effect of the Invention

According to the first invention, it is possible to provide the cavity resonator with stagger function so as to broaden the resonant frequency band of the cavity resonator by the space between the side wall of the resonator body and the reaction tube in the cavity of the resonator body whose cross-section is the axisymmetric convex polygon or the circle being partitioned into a plurality of sub-spaces concentrically to the resonator body and in nested manner by one or more square tubes or cylinders each of which extends along the axis of the resonator body and has the grid pattern made of non-magnetic material on its side surface.

According to the second invention, it is possible to provide the cavity resonator with stagger function so as to broaden the resonant frequency band of the cavity resonator by the space between the side wall of the resonator body and the reaction tube in the cavity of the resonator body whose cross-section is the axisymmetric convex polygon being partitioned into a plurality of sub-spaces in the direction perpendicular to the axis of symmetry of the cross-section of the resonator body by one or more partition plates each of which extends along the axis of the resonator body and has the grid pattern made of non-magnetic material on its side surface.

According to the third invention, it is possible to provide the cavity resonator with stagger function so as to broaden the resonant frequency band of the cavity resonator by the space between the side wall of the resonator body and the reaction tube in the cavity of the resonator body whose cross-section is the axisymmetric convex polygon being partitioned into a plurality of sub-spaces in the direction parallel to the axis of symmetry of the cross-section of the resonator body by one or more partition plates each of which extends along the axis of the resonator body and has the grid pattern made of non-magnetic material on its side surface.

Thus, according to the present invention, the electromagnetic field of $TE_{101}$ mode is maintained in the cavity resonator, even though the resonant frequency fluctuates due to generation of plasma, and thereby, the supply of high-voltage microwave to the cavity resonator is continued so that the remote plasma is generated more effectively.

Furthermore, according to the present invention, it is possible to broaden the resonant frequency band of a conventional cavity resonator only by relatively simple structural modification of the cavity resonator, and therefore, a correcting mechanism for fluctuation of the resonant frequency during operation of the microwave plasma generating apparatus is not required, which leads to reduction of the manufacturing cost of the apparatus.

BEST MODE FOR CARRYING OUT THE INVENTION

Figure 1A:
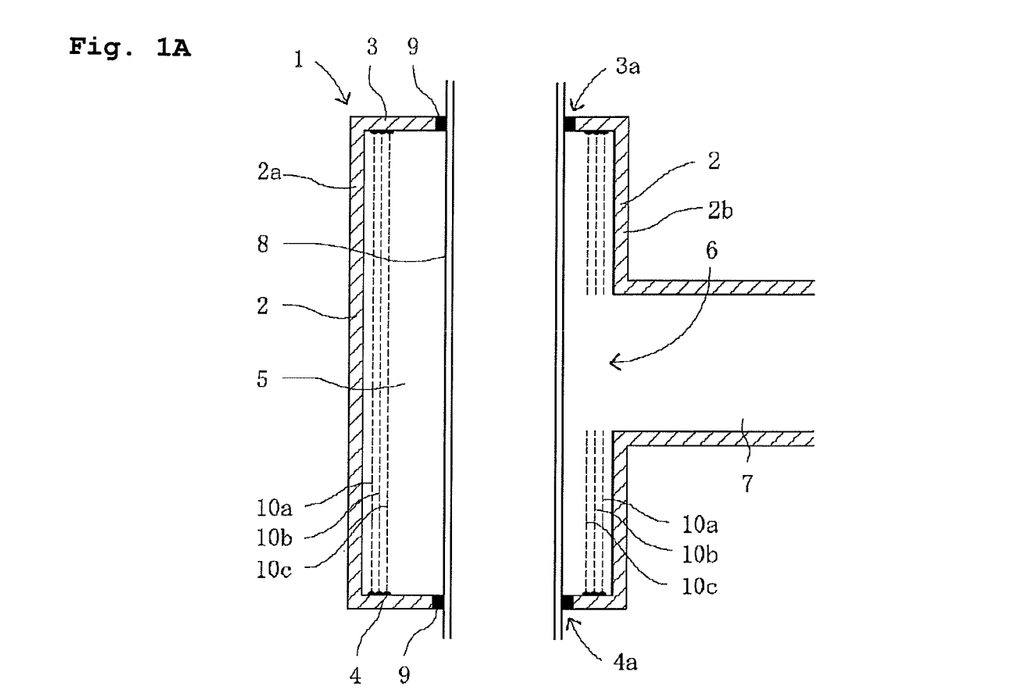
FIG. 1A is a vertical cross-sectional view of a cavity resonator of a microwave plasma generating apparatus according to an embodiment of the present invention.
Figure 1B:
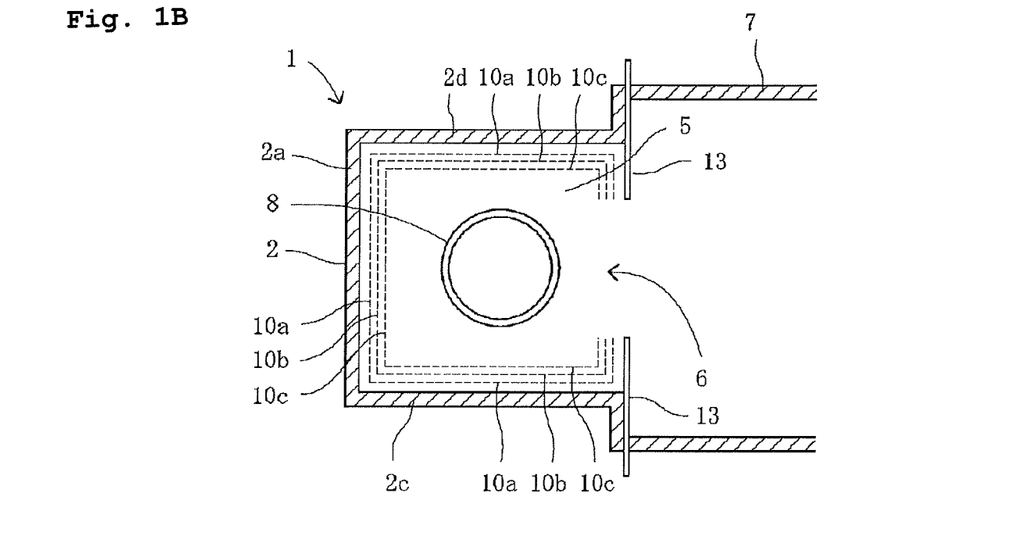
FIG. 1B is a cross-sectional view the cavity resonator shown in FIG. 1A.

FIG. 1A is a vertical cross-sectional view of a cavity resonator of a microwave plasma generating apparatus according to an embodiment of the present invention, and FIG. 1B is a cross-sectional view the cavity resonator shown in FIG. 1A. FIG. 2 is a perspective view showing an example of a square tube arranged in the cavity resonator shown in FIGS. 1A and 1B.

Referring to FIG. 1, the cavity resonator according to the present invention comprises a resonator body 1 made of conductor. The resonator body 1 is composed of a square-tube-shaped side wall whose cross-section is rectangular or square, an upper wall 3 closing the upper end opening of the side wall 2 and a lower wall 4 closing the lower end opening of the side wall 2. A cavity 5 is formed within the resonator body 1.

The side wall 2 of the resonator body 1, that is, one side wall portion 2b of four rectangular side wall portions 2a-2d which form the side wall 2 is provided with a microwave supply opening 6. In this case, a normal line at the center of the microwave supply opening 6 extends along an axis of symmetry of a cross-section of the side wall 2. The upper and lower walls 3, 4 of the resonator body 1 are provided with a pair of reaction tube attachment openings 3a, 4a. In this case, it is preferable to arrange the pair of reaction tube attachment openings 3a, 4a at a position slightly displaced from the center of the upper and lower walls 3, 4 toward the microwave supply opening 6. Thereby plasma is generated uniformly along the central axis of a reaction tube 8 (as will hereinafter be described in detail).

A wave guide 7 is connected to the microwave supply opening 6 through an inductive window 13 (also referred to as "an inductive iris"). The inductive window 13 consists of a pair of plates arranged at both sides of the microwave supply opening 6 for slide movement in a direction perpendicularly across the axis of the resonator body 1. The opening space of the inductive window 13 is set by adjusting a distance between the pair of plates. A reaction tube 8 made of dielectric (in this embodiment, a silica tube) is attached to the reaction tube attachment openings 3a, 4a through an annular securing member 9 in such a way that the reaction tube 8 extends vertically through the cavity 5 and cross an axis of the wave guide 7.

The cavity resonator comprises three square tubes 10a-10c which are arranged in nested manner in the cavity 5 at a distance from both the interior surface of the side wall 2 and the reaction tube 8 and extend between the upper and lower walls 3, 4.

Figure 2A:
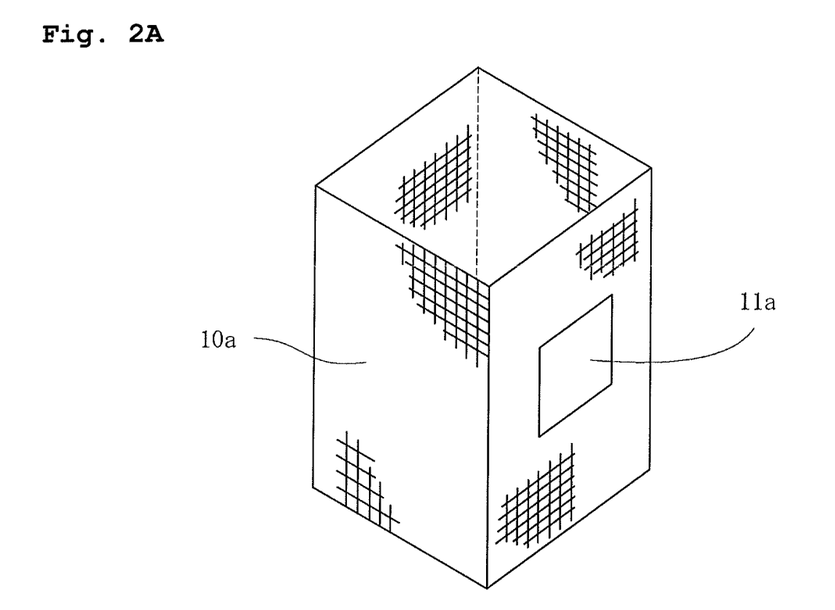
FIG. 2A is a perspective view showing an example of a square tube arranged in the cavity resonator shown in FIGS. 1A and 1B.

One square tube 10a, as a representative example of those three square tubes 10a-10c, is shown in FIG. 2A. Referring to FIG. 2A, the square tube 10a is composed of a non-magnetic metal mesh and has a cross-section similar to a cross-section of the cavity 5 (in this embodiment, rectangular or square cross-section). In this case, preferably, the mesh size is smaller than λ/4 (λ is a wave length of a microwave supplied to the resonator body 1), and the aperture ratio of the mesh (the percentage of opening area in the mesh) is as large as possible.

The square tube 10a is arranged concentrically to the resonator body 1 and the side surface of the square tube 10a is provided with an opening 11a at its area which is arranged between the reaction tube 8 and the microwave supply opening 6 and opposed to the microwave supply opening 6. Thus the three square tubes 10a-10c whose cross-sections differ from each other in the size are arranged concentrically to the resonator body 1 and in nested manner in the cavity 5 of the resonator body 1 in such a manner that each of the openings 11a is overlapped with the microwave supply opening 6 (an opening of the inductive window 13), and the square tubes 10a-10c are electrically connected to the upper and lower walls 3, 4 of the resonator body 1 at upper and lower ends thereof.

In this case, the configuration of the square tubes 10a-10c is not limited to this embodiment. The square tubes 10a-10c may have any configuration insofar as each of the square tubes 10a-10c has a cross-section similar to a cross-section of the cavity 5 and is arranged concentrically to the resonant body 1 and a grid pattern made of non-magnetic metal is provided on the whole of the side surface of each of the square tubes 10a-10c, and the side surface of each of the square tubes 10a-10c is provided with the opening corresponding to the microwave supply opening 6.

Figure 2B:
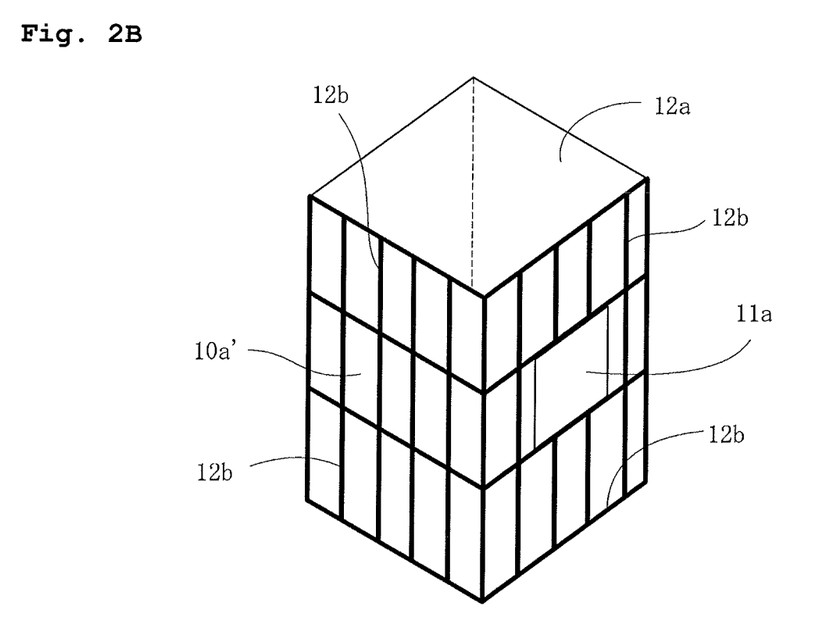
FIG. 2B is a perspective view showing an example of a square tube arranged in the cavity resonator shown in FIGS. 1A and 1B.

For example, instead of the square tube composed of the non-magnetic metal mesh, as shown in FIG. 2B, a square tube 12a composed of a non-metallic plate having high heat resistance and provided with a grid pattern formed by non-magnetic metal strips 12b all over a surface thereof may be used as a square tube 10a'. In this case, preferably, the long side of each of openings of the grid is shorter than λ/4 (λ is a wave length of a microwave supplied to the resonant body 1) and the aperture ratio of the grid (the percentage of opening area in the grid) is as large as possible.

Also, for example, the square tube may be composed of a grid made of non-magnetic metal or a punched plate. In this case, preferably, the long side of each of openings of the grid or the diameter of holes of the punched plate is smaller (shorter) than λ/4 (λ is a wave length of a microwave supplied to the resonator body 1) and the aperture ratio of the grid (the percentage of opening area in the grid or the punched plate) is as large as possible. Alternatively, for example, the square tube may be composed of a dielectric square tube provided with a grid of non-magnetic metal layer thereon.

Size of each part of the resonator body 1 are determined as follows. The wave guide 7 is a rectangular wave guide and generally designed in such a way that the ratio of the long side to the short side of its cross-section is 2:1. In this embodiment, the wave guide 7 is connected to the microwave supply opening 6 of the resonator body 1 through the inductive window 13 in such a manner that the short side thereof is parallel to the axis of the resonator body 1. In this regard, a wavelength $\lambda_g$ in the wave guide 7 is determined by the following relation (1);

$$\lambda_g = \frac{\lambda_0}{\sqrt{1 - \left(\frac{\lambda_0}{2d}\right)}} \tag{1}$$

where (d) is a length of the long side of the wave guide 7 and $\lambda_0$ is a wave length of a microwave in vacuum.

Further, a width (a) of the cavity 5 of the resonator body 1 measured along a direction perpendicular to the axis of the wave guide 7, a height (b) of the cavity 5, and a length (c) of the cavity 5 measured along a direction parallel to the axis of the wave guide 7 are determined by the following relation (2) when a mode of electromagnetic field to be generated within the resonator body 1 is $TE_{mns}$:

$$f_0 = \frac{v_0 \sqrt{\left(\frac{m}{a}\right)^2 + \left(\frac{n}{b}\right)^2 + \left(\frac{s}{c}\right)^2}}{2} \tag{2}$$

where $f_0$ is a frequency of a microwave supplied to the resonator body 1 and $v_0$ is a light speed. In the present invention, the settings is carried out in such a way that the electromagnetic field of $TE_{101}$ mode is generated within the resonator body 1 and thereby, m=1, n=0, and s=1 in the relation (2).

In this case, it is noted that the size (the width (a), the height (b) and the length (c)) of the cavity 5 determined by the relation (2) is only the numerical value when the reaction tube 8 is not attached to the resonator body 1. Since the reaction tube 8 is made of dielectric, when the reaction tube 8 is attached to the resonator body 1, a wave length of electromagnetic field in the cavity 5 becomes shorter than the preset default value. As a result, the resonant frequency of the resonator body 1 set by the relation (2) fluctuates so that the fluctuation has to be corrected (as is the case in the above-mentioned prior art).

Furthermore, when a plasma is generated within the reaction tube 8, a wave length of electromagnetic field in the cavity 5 is stretched by the plasma. As a result, the resonant frequency of the resonator body 1 set by the relation (2) fluctuates so that the fluctuation has to be corrected (as is the case in the above-mentioned prior art).

In this regard, according to the present invention, just like the resonator body 1 (the interior surface of its side wall), each of the square tubes 10a-10c partitioning the cavity 5 of the resonator body 1 has a resonant frequency determined by the relation (2) according to its size. Consequently, when the reaction tube 8 is not attached to the resonator body 1 and the $TE_{101}$ mode is maintained within the resonator body, the resonator body 1 has the following four resonant frequencies:

(1) $f_1$=a resonant frequency achieved by the interior surface of the side wall 2 of the resonator body 1 (the minimum value).
(2) $f_2$=a resonant frequency achieved by the first square tube 10a.
(3) $f_3$=a resonant frequency achieved by the second square tube 10b.

(4) $f_4$=a resonant frequency achieved by the third square tube 10c (the maximum value). In other words, the resonator body 1 has a resonant frequency band in the range of $f_1$-$f_4$.

Meanwhile, the above-mentioned fluctuation of the resonant frequency caused by the attachment of the reaction tube to the resonator body and the generation of plasma only arises within the frequency band $f_1$-$f_4$. Therefore, the correction of the fluctuation of resonant frequency is not required at all.

Figure 3:
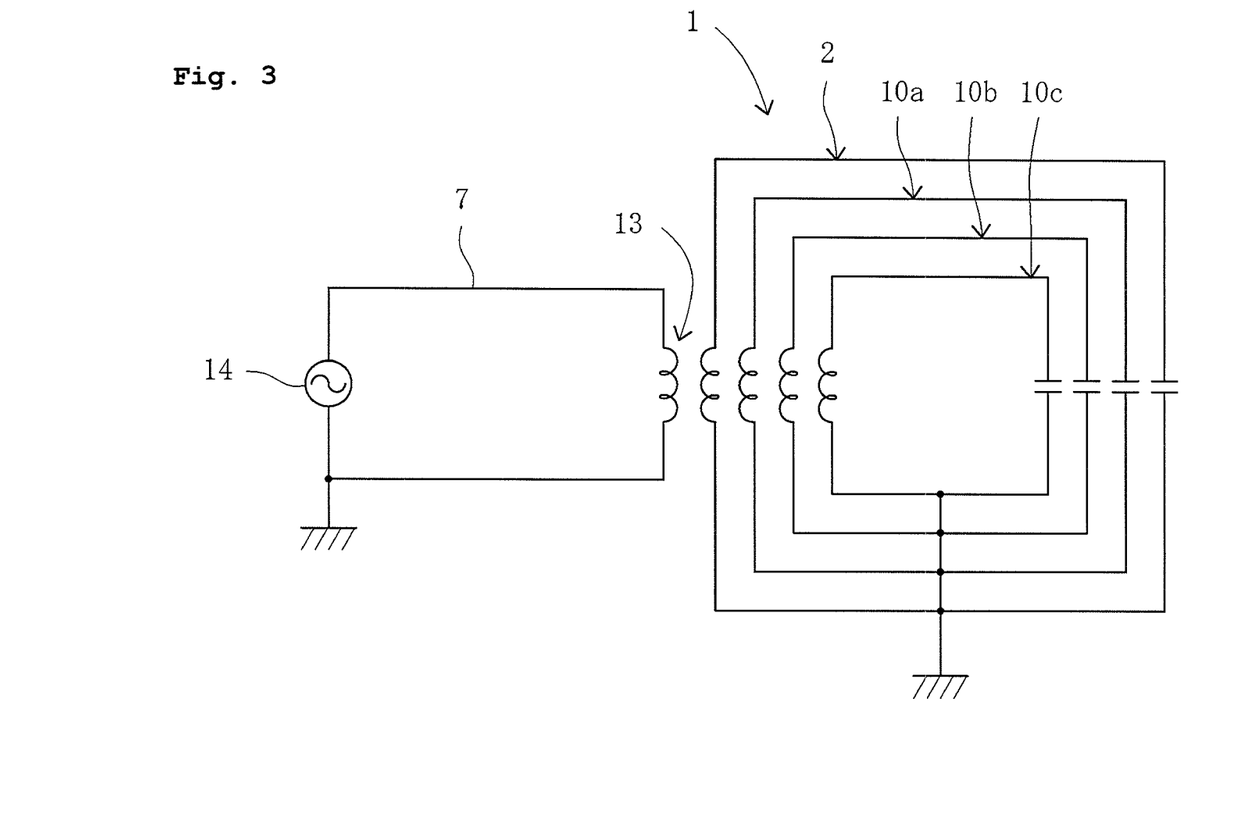
FIG. 3 is a circuit diagram of an equivalent circuit of the cavity resonator shown in FIGS. 1A and 1B.

FIG. 3 is a circuit diagram of an equivalent circuit of the cavity resonator shown in FIGS. 1A and 1B. In FIG. 3, circuit elements corresponding to the structural elements shown in FIG. 1 are identified with the same reference numerals as those of FIG. 1. In FIG. 3, the reference numeral 14 designates a high-frequency power source. As shown in FIG. 3, the resonator body 1 is magnetically coupled to the wave guide 7 through the inductive window 13. Then the critical coupling between the resonator body 1 and the wave guide 7 is achieved by regulation of the inductive window 13.

Figure 4:
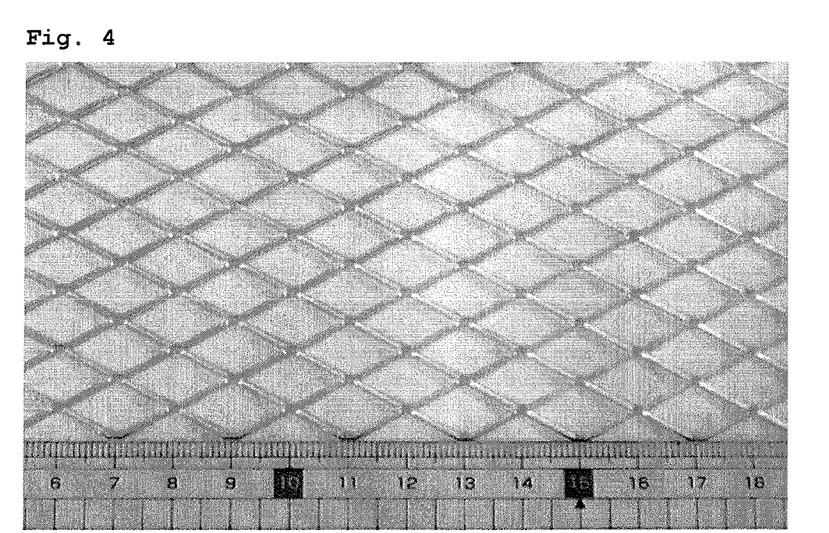
FIG. 4 is a magnified photograph of a non-magnetic metal mesh applied to the square tube of the cavity resonator shown in FIG. 1.

It was checked how large the resonant frequency characteristic of the cavity resonator of the present invention broadened. A cavity resonator whose structure was the same as that of FIG. 1 was formed. Each of the square tubes 10a-10c was made of a non-magnetic metal mesh as shown in FIG. 4. The size of each part of the cavity resonator was as follows:

A length of the long side of the wave guide 7=109.2 mm.
A length of the short side of the wave guide 7=54.6 mm.
A width $a_0$ of the cavity 5 of the resonator body 1=90 mm.
A height $b_0$ of the cavity 5 of the resonator body 1=163.8 mm.
A length $c_0$ of the cavity 5 of the resonator body 1=80 mm.
A width $a_1$ of the interior space of the first square tube 10a=85 mm.
A length $c_1$ of the interior space of the first square tube 10a=75 mm.
A width $a_2$ of the interior space of the second square tube 10b=79 mm.
A length $c_2$ of the interior space of the second square tube 10b=69 mm.
A width $a_3$ of the interior space of the third square tube 10c=73 mm.
A length $c_3$ of the interior space of the third square tube 10c=75 mm.
The size of aperture of the inductive window=42 mm.
An inner diameter of the reaction (crystal) tube 8=50 mm.
A thickness of the reaction tube 8=5 mm.

Figure 6:
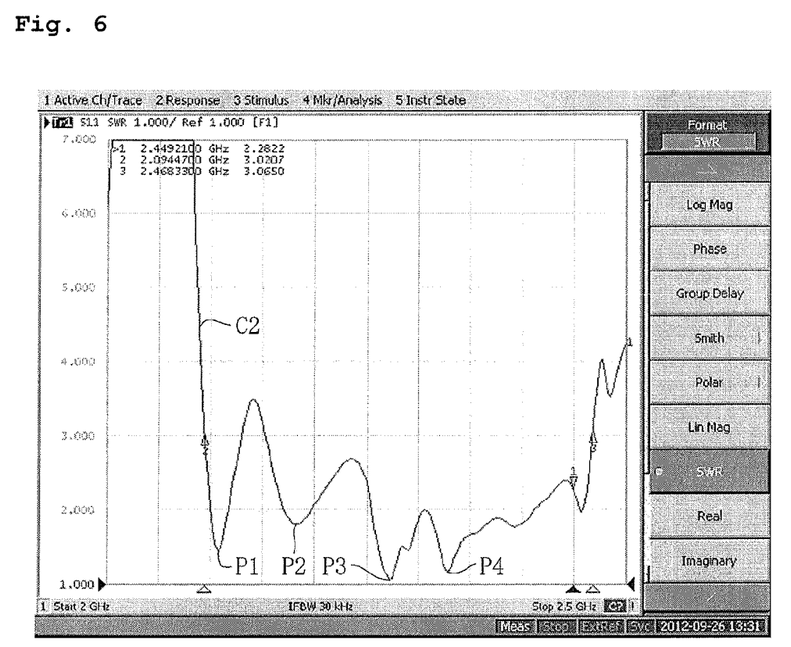
FIG. 6 is a graph showing the resonant frequency characteristic of the cavity resonator shown in FIG. 1.

Next, the standing wave ratio (SWR) of the cavity resonator with the reaction tube attached to the resonator body was measured by a vector network analyzer. FIG. 6 is a graph showing a result of the measurement. In the graph of FIG. 6, the vertical axis represents an SWR value and the horizontal axis represents a frequency (GHz). The scale unit of the horizontal axis of this graph is 50 MHz because the scale ranges from 2 GHz to 2.5 GHz.

Figure 5:
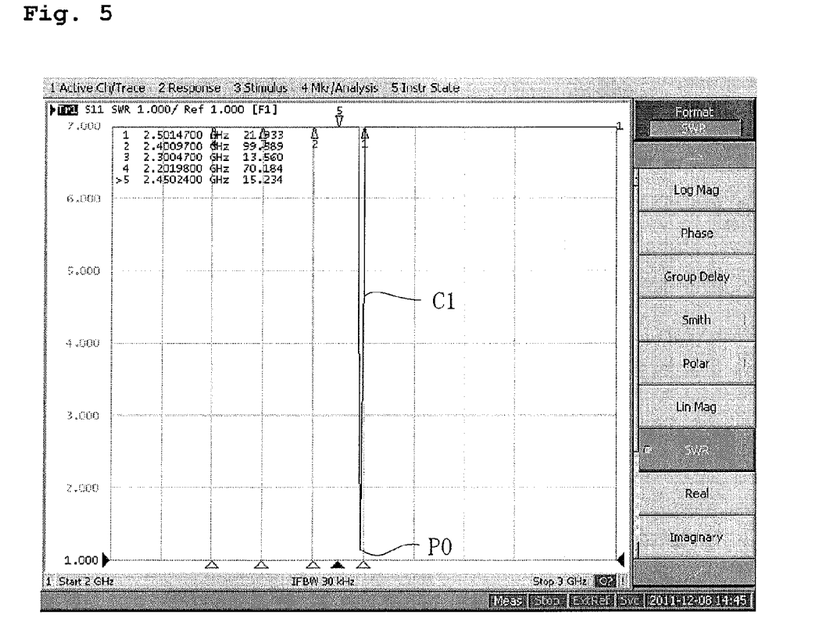
FIG. 5 is a graph showing the resonant frequency characteristic of the cavity resonator shown in FIG. 1 without the square tubes.

Meanwhile, a similar measurement was carried out using the cavity resonator in which the square tubes 10a-10c are removed from the resonator body 1. FIG. 5 is a graph showing a result of the measurement. In the graph of FIG. 5, the vertical axis represents an SWR value and the horizontal axis represents a frequency (GHz). The scale unit of the horizontal axis of this graph is 100 MHz because the scale ranges from 2 GHz to 3 GHz.

In comparison with the graphs shown in FIGS. 5 and 6, in the graph of FIG. 5, an SWR curve C1 has its minimum value at a point $P_0$, where the curve C1 forms a very narrow peak. On the other hand, in the graph of FIG. 6, an SWR curve C2 has its minimum values at four points (P1-P4). In this case, the points P1-P4 are associated with the interior surface of the side wall 2 of the resonator body 1, the first square tube 10a, the second square tube 10b and the third square tube 10c, respectively.

From the results of the measurements, it is proved that the resonator body 1 achieves a stagger function and the resonant frequency of the resonator body 1 broadens by arranging the square tubes 10a-10c made of non-magnetic metal mesh in nested manner in the cavity 5 and concentrically to the resonator body 1.

Figure 7:
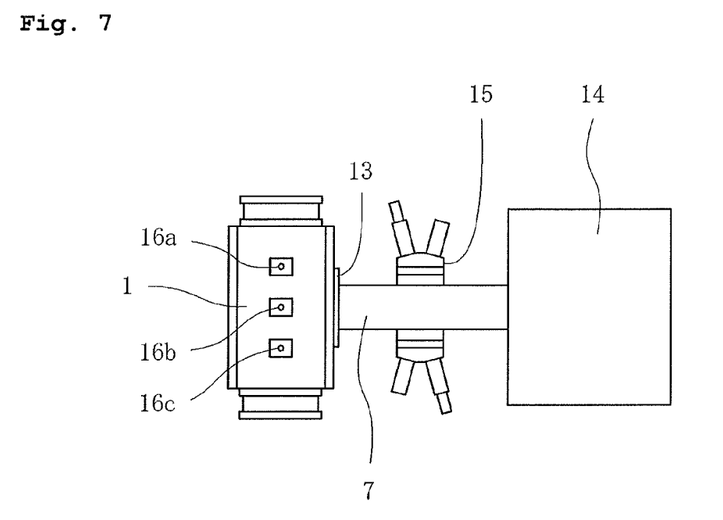
FIG. 7 is a side view illustrating an example of configuration of a microwave plasma generating apparatus provided with the cavity resonator shown in FIG. 1.

FIG. 7 is a side view illustrating an example of configuration of a microwave plasma generating apparatus provided with the cavity resonator shown in FIG. 1. Since the resonator body 1 has broadband resonant frequency as mentioned above, a microwave plasma generating apparatus according to the present invention has, as shown in FIG. 7, a very simple configuration which is composed of only the resonator body 1, a high frequency power source 14, the wave guide 7 connecting between the resonator body 1 and the high frequency power source 14, and an incident power/reflected power measuring equipment 15 located midway in the wave guide 7. In FIG. 7, the reference numerals 16a-16c designate observation windows provided for visually confirming if the plasma is generated uniformly within the reaction tube 8.

In this microwave plasma generating apparatus, before the apparatus starts operating to generate the plasma, the inductive window 13 is adjusted by checking the measurement value of the incident power/reflected power measuring equipment 15 so as to set the size of the aperture of the inductive window in such a way that the critical coupling between the resonator body 1 and the wave guide is achieved.

Thus, according to the present invention, the electromagnetic field of $TE_{101}$ mode is maintained in the cavity resonator, even though the resonant frequency fluctuates due to generation of plasma, and consequently, the supply of high-voltage microwave to the cavity resonator is continued so that the remote plasma is generated more effectively.

Furthermore, according to the present invention, it is possible to broaden the resonant frequency band of a conventional cavity resonator only by relatively simple structural modification of the cavity resonator, and thereby, a correcting mechanism for fluctuation of the resonant frequency during operation of the microwave plasma generating apparatus is not required, which leads to reduction of the manufacturing cost of the apparatus.

Although the present invention has been explained based on one preferred embodiment thereof, the structural features of the present invention are not limited to this embodiment. One skilled in the art can easily devise various modified embodiments within the scope of the claims of the present application.

Figure 9A:
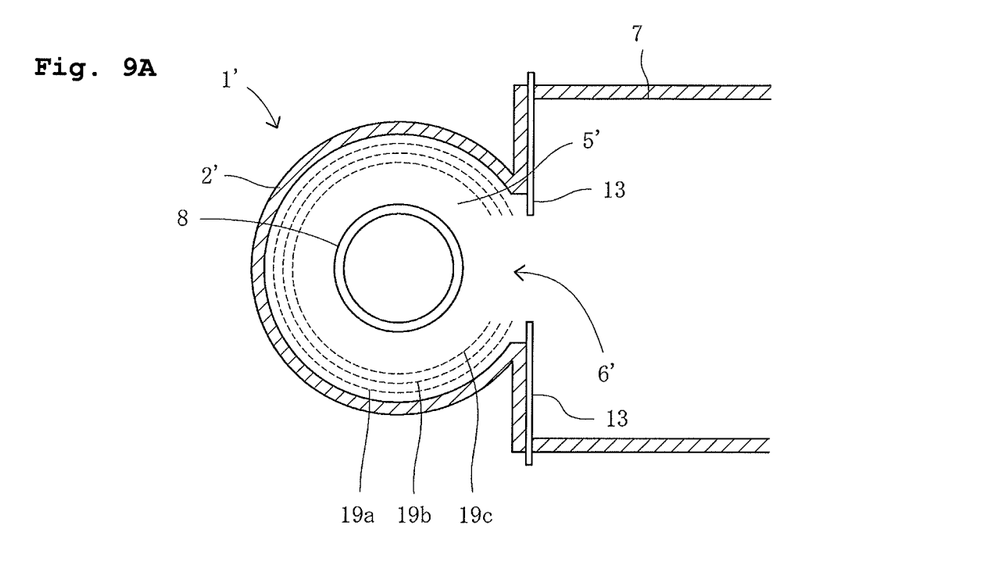
FIG. 9A is a sectional view similar to FIG. 1B showing a cavity resonator according to further embodiment of the present invention.

For example, the resonator body may have a cylindrical side wall as shown in FIG. 9A, though the resonator body has the square-tube-shaped side wall in the above-mentioned embodiment. Referring to FIG. 9A, when the resonator body 1' has the cylindrical side wall 2', in place of one or more square tubes, one or more cylinders 19a-19c are arranged in nested manner in the cavity 5' of the resonator body 1' and concentrically to the resonator body 1' at a distance from both the interior surface of the side wall 2' and the reaction tube 8.

Just like the square tube 10a-10c shown in FIG. 1, insofar as the cylinder 19a-19c has a cross-section similar to the cross-section of the cavity 5' and is arranged concentrically to the resonator body 1', and a grid pattern made of non-magnetic metal is provided on the whole of a side surface of the cylinder 19a-19c, and the side surface of the cylinder 19a-19c in provided with an opening corresponding to the microwave supply opening 6', the cylinder 19a-19c may have any configuration. The cylinder 19a-19c extends between the upper and lower walls of the resonator body 1', and is electrically connected to the upper and lower walls of the resonator body 1' at upper and lower ends thereof When the resonator body 1 has a circular cross-section, a radius (r) and a height (L) of the cavity 5 of the resonator body 1 are determined by the following relation (3) when a mode of electromagnetic field to be generated within the resonator body 1 is $TE_{mns}$ ($TE_{010}$ mode under normal conditions):

$$f_0 = \frac{v_0 \sqrt{\left(\frac{x_{mn}}{\pi r}\right)^2 + \left(\frac{s}{l}\right)^2}}{2} \quad (3)$$

where $f_0$ is a frequency of a microwave supplied to the resonator body 1 and $v_0$ is a light speed.

Also, in the configurations shown in FIGS. 1 and 9A, dielectric bodies may be arranged in gaps between the outermost square tube 10a or cylinder 19a and the interior surface of the side wall 2, 2' and between the adjacent square tubes 10a, 10b; 10b, 10c or cylinders 19a, 19b; 19b, 19c, the dielectric bodies having shapes corresponding to the shapes of the associated gaps.

Figure 8A:
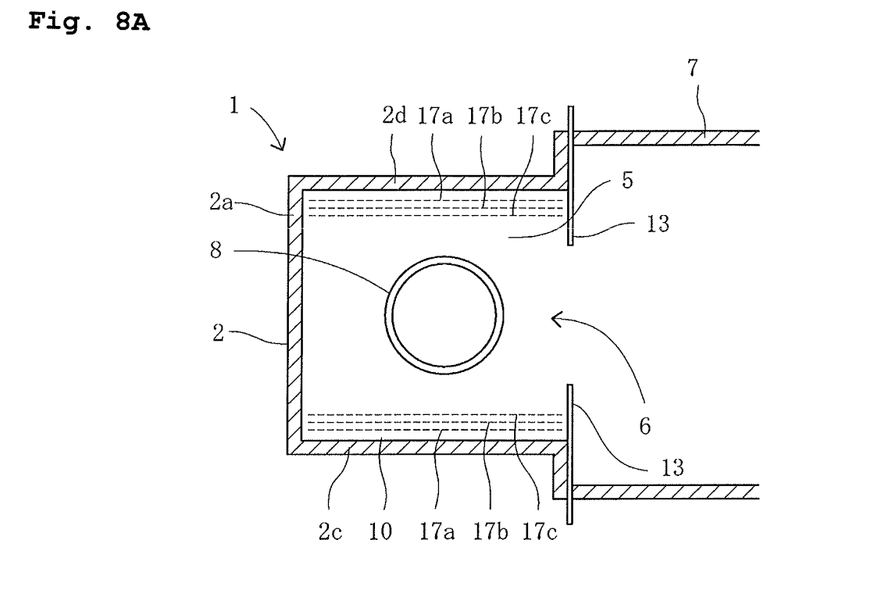
FIG. 8A is a sectional view similar to FIG. 1B showing a cavity resonator according to another embodiment of the present invention.
Figure 8B:
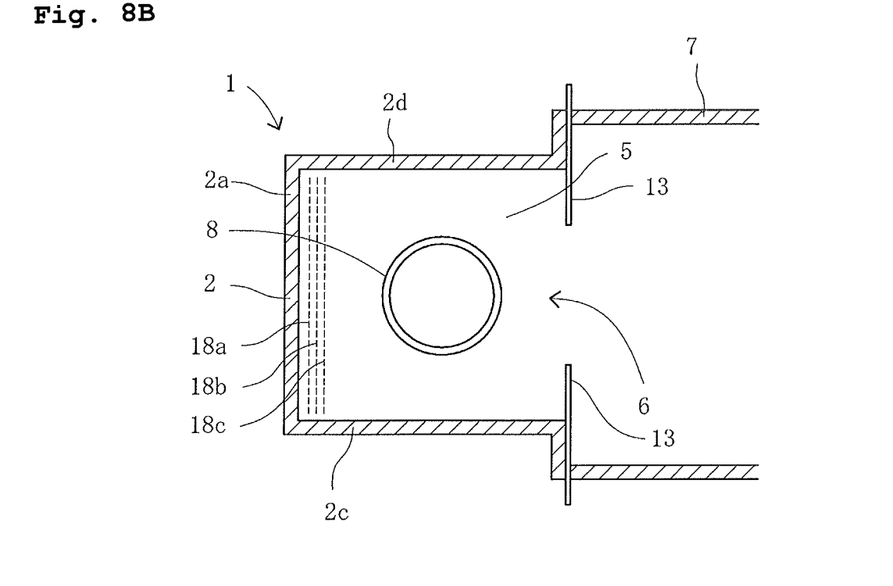
FIG. 8B is a sectional view similar to FIG. 1B showing a cavity resonator according to another embodiment of the present invention.

When the resonator body 1 has an axisymmetric convex polygon cross-section, in place of one or more square tubes 10a-10c, as shown in FIGS. 8A and 8B, a space between the reaction tube 8 and the interior surface of the side wall 2 within the cavity 5 may be partitioned into a plurality of sub-spaces by one or more partition plates extending along the axis of the resonator body 1.

In the embodiment shown in FIG. 8A, a plurality of partition plates 17a-17c are spaced from each other in a direction perpendicular to the axis of symmetry of the cross-section of the resonator body 1, extend parallel to the axis of symmetry at intervals and are arranged symmetrically about the axis of symmetry. Furthermore, a grid pattern made of non-magnetic metal is provided on the whole of a side surface of each of the partition plates 17a-17c, and the partition plates 17a-17c are electrically connected to the upper and lower walls of the resonator body 1 at upper and lower ends thereof. Side edges of each of the partition plates 17a-17b are arranged at a distance from the interior surface of the side wall 2.

In the embodiment shown in FIG. 8B, a plurality of partition plates 18a-18c are spaced from each other in a direction parallel to the axis of symmetry of the cross-section of the resonator body 1 and extend perpendicularly to the axis of symmetry, and a grid pattern made of non-magnetic metal is provided on the whole of a side surface of each of the partition plates 18a-18c, and the partition plates 18a-18c are electrically connected to the upper and lower walls of the resonator body 1 at upper and lower ends thereof. Side edges of each of the partition plates 17a-17b are arranged at a distance from the interior surface of the side wall 2. In this case, the partition plate is provided with an opening at its area which is arranged between the reaction tube 8 and the microwave supply opening 6 and opposed to the microwave supply opening 6.

According to another embodiment of the present invention, dielectric bodies are arranged in gaps between the outermost square tube or cylinder and the interior surface of the side wall of the resonator body and between the adjacent square tubes or cylinders, the dielectric bodies having shapes corresponding to the shapes of the associated gaps.

Also, though the side wall 2 of the resonator body 1 has rectangular or square cross-section in the embodiment shown in FIG. 1, the cross-section of the square-tube-shaped side wall 2 is not limited to this embodiment, and the side wall 2 may have any axisymmetric convex polygon cross-section.

Figure 9B:
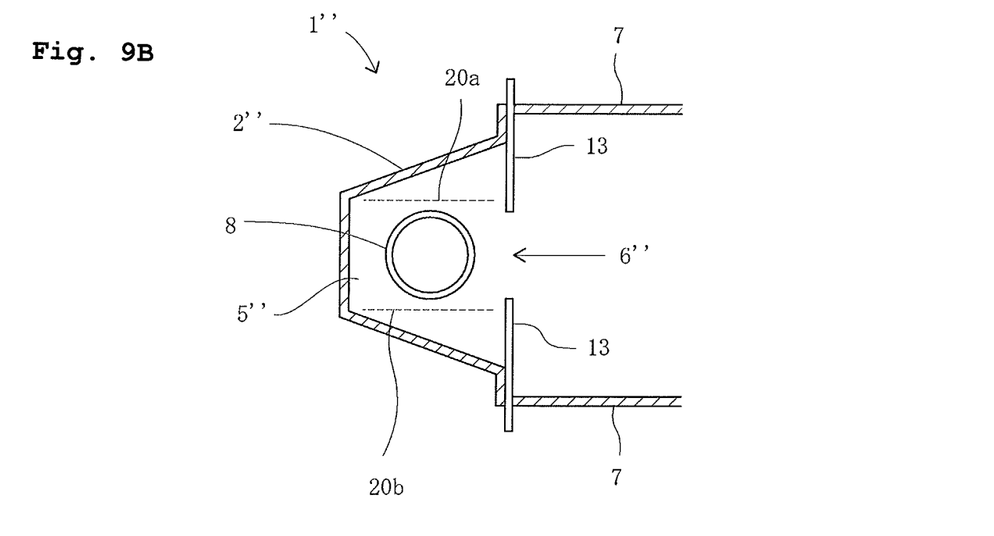
FIG. 9B is a sectional view similar to FIG. 1B showing a cavity resonator according to further embodiment of the present invention.

FIG. 9B is a sectional view similar to FIG. 1B showing a cavity resonator according to further embodiment of the present invention, in which the square-tube-shaped side wall has an isosceles trapezoid cross-section. Referring to FIG. 9B, in this embodiment, an axis of symmetry of the cross-section of the side wall 2" is a straight line through centers of upper and lower bases of the isosceles trapezoid. The side wall 2" of the resonator body 1" is provided with a microwave supply opening 6" at its wall surface forming the lower base of the cross-section. A pair of partition plates 20a, 20b which have grid patterns made of non-magnetic metal at the whole of the side surface thereof is arranged symmetrically at both sides of the reaction tube 8 along a direction perpendicular to the axis of symmetry.

DESCRIPTION OF REFERENCE NUMERALS 1, 1', 1" Resonator body
2, 2', 2" Side wall
2a, 2b First side wall portion
2c, 2d Second side wall portion
3 Upper wall
3a Reaction tube attachment opening
4 Lower wall
4a Reaction tube attachment opening
5, 5', 5" Cavity
6, 6', 6" Microwave supply opening
7 Wave guide
8 Reaction tube
9 Securing member
10a-10c Square tube
10a' Square tube
11a Opening
12a Square tube
12b Non-magnetic metal strips
13 Inductive window
14 High frequency power source
15 Incident power/reflected power measuring equipment
16a-16c Observation window
17a-17c Partition plate
18a-18c Partition plate
19a-19c Cylinder
20a, 20b Partition plate

The invention claimed is:
1. A cavity resonator incorporated in an apparatus for generating a plasma by microwave excitation, the cavity resonator comprising:
an electrically conducting, resonator body having upper and lower walls spaced apart along a longitudinal axis, and a tubular side wall extending along the longitudinal axis to connect to the upper and lower walls at open ends thereof, the tubular side wall having an opening, the upper and lower walls and the tubular side wall bounding an interior cavity in communication with the opening;

a waveguide coupled to the opening of the tubular side wall through an adjustable window and extending along a waveguide axis that is generally perpendicular to the longitudinal axis, for supplying a microwave at a resonant frequency to the interior cavity;

an electrically insulating, reaction tube for conveying a gas to be ionized by the supplied microwave to generate the plasma within the reaction tube, the reaction tube extending longitudinally through the upper and lower walls in the interior cavity; and one or more electrically conducting elements spaced away from the tubular side wall, extending along the longitudinal axis in the interior cavity, and electrically connected to the upper and lower walls to correct fluctuations in the resonant frequency, the elements also being remote from, and not blocking, the opening to enable the supplied microwave to freely enter the interior cavity.

2. The cavity resonator of claim 1, wherein the tubular side wall of the resonator body has a polygonal cross-section, and wherein the elements constitute polygonal tubes symmetrical with the longitudinal axis and nested with one another, each polygonal tube having a polygonal cross-section of complementary contour to the polygonal cross-section of the tubular side wall, and wherein each polygonal tube electrically connects to the upper and lower walls of the resonator body at open ends thereof and has an opening opposed to, and corresponding to, the opening of the tubular side wall.

3. The cavity resonator of claim 2, wherein each polygonal tube is constituted of a non-magnetic metal material and is configured as one of a mesh and a grid.

4. The cavity resonator of claim 2, further comprising dielectric fillers arranged in gaps between the polygonal tubes and a gap between an outermost polygonal tube and the tubular side wall of the resonator body.

5. The cavity resonator of claim 2, wherein each polygonal tube is constituted of a dielectric material and has a surface on which a non-magnetic metal material layer is coated in grid patterns.

6. The cavity resonator of claim 2, wherein each polygonal cross-section is an axisymmetric convex polygon cross-section.

7. The cavity resonator of claim 1, wherein the tubular side wall of the resonator body has a circular cross-section, and wherein the elements constitute cylindrical tubes concentric with the longitudinal axis and nested with one another, each cylindrical tube having a circular cross-section of complementary contour to the circular cross-section of the tubular side wail, and wherein each cylindrical tube electrically connects to the upper and lower walls of the resonator body at open ends thereof and has an opening opposed to, and corresponding to, the opening of the tubular side wall.

8. The cavity resonator of claim 7, wherein each cylindrical tube is constituted of a non-magnetic metal material and is configured as one of a mesh and a grid.

9. The cavity resonator of claim 7, further comprising dielectric fillers arranged in gaps between the cylindrical tubes and a gap between an outermost cylindrical tube and the tubular side wall of the resonator body.

10. The cavity resonator of claim 7, wherein each cylindrical tube is constituted of a dielectric material and having a surface on which a non-magnetic metal material layer is coated in a grid pattern.

11. The cavity resonator of claim 1, wherein the tubular side wall of the resonator body has a polygon cross-section, and wherein the elements constitute partition plates extending parallel with both the longitudinal axis and the waveguide axis, the partition plates being symmetrical with the longitudinal axis and being spaced apart, and wherein each partition plate electrically connects to the upper and lower walls of the resonator body at upper and lower edges thereof and has grid patterns of non-magnetic metal on both faces thereof.

12. The cavity resonator of claim 11, wherein each partition plate is constituted of a non-magnetic metal material and is configured as one of a mesh and a grid.

13. The cavity resonator of claim 11, further comprising dielectric fillers arranged in gaps between the partition plates and a gap between an outermost partition plate and the tubular side wall of the resonator body.

14. The cavity resonator of claim 11, wherein each partition plate is constituted of a dielectric material and has a surface on which a non-magnetic metal material layer is coated in grid patterns.

15. The cavity resonator of claim 1, wherein the tubular side wall of the resonator body has a polygon cross-section, and wherein the elements constitute partition plates extending parallel with the longitudinal axis and perpendicular to the waveguide axis and being spaced apart, and wherein each partition plate electrically connects to the upper and lower walls of the resonator body at upper and lower edges thereof and has grid patterns of non-magnetic metal material on both faces thereof.

16. The cavity resonator of claim 15, wherein each partition plate is constituted of a non-magnetic metal material and is configured as one of a mesh and a grid.

17. The cavity resonator of claim 15, further comprising dielectric fillers arranged in gaps between the partition plates and a gap between an outermost partition plate and the tubular side wall of the resonator body.

18. The cavity resonator of claim 15, wherein each partition plate is constituted of a dielectric material and has a surface on which a non-magnetic metal material layer is coated in grid patterns.

* * * * *